(12) United States Patent
Kroeninger et al.

(10) Patent No.: US 7,918,714 B2
(45) Date of Patent: Apr. 5, 2011

(54) METHODS FOR TREATING WAFERS ON ASSEMBLY CARRIERS

(75) Inventors: Werner Kroeninger, Regensburg (DE); Manfred Schneegans, Vaterstetten (DE)

(73) Assignee: Infineon Technologies AG, Neubiberg (DE)

( * ) Notice: Subject to any disclaimer, the term of this patent is extended or adjusted under 35 U.S.C. 154(b) by 803 days.

(21) Appl. No.: 11/852,885

(22) Filed: Sep. 10, 2007

(65) Prior Publication Data

US 2008/0057834 A1    Mar. 6, 2008

Related U.S. Application Data

(63) Continuation of application No. PCT/EP2006/050783, filed on Feb. 8, 2006.

(30) Foreign Application Priority Data

Mar. 10, 2005  (DE) .......................... 10 2005 011 107

(51) Int. Cl.
    *B24B 1/00*     (2006.01)
    *B29C 65/76*    (2006.01)
(52) U.S. Cl. ................. 451/41; 156/80; 451/53; 451/63
(58) Field of Classification Search .................... 451/41, 451/53, 63; 156/80; 438/977
    See application file for complete search history.

(56) References Cited

U.S. PATENT DOCUMENTS

| 2,984,897 | A |   | 5/1961 | Godfrey |
| 5,394,707 | A | * | 3/1995 | Miller et al. .................... 62/345 |
| 5,791,973 | A |   | 8/1998 | Nishio |
| 6,682,990 | B1 |  | 1/2004 | Iwane et al. |
| 6,683,332 | B2 |  | 1/2004 | Shinozaki et al. |
| 2007/0221254 | A1 | * | 9/2007 | Izumi et al. .................... 134/26 |

FOREIGN PATENT DOCUMENTS

| DE | 103 19 272 A1 | 11/2004 |
| EP | 0 737 546 A2 | 10/1996 |
| EP | 1 148 554 A2 | 10/2001 |
| JP | 7-283293 A | 10/1995 |
| JP | 8-64662 | 3/1996 |
| JP | 9-123059 | 5/1997 |
| WO | WO 03/003428 A2 | 1/2003 |

OTHER PUBLICATIONS

Tong, Q.-Y., et al., "Semiconductor Wafer Bonding," 1999, pp. 1-6, John Wiley & Sons, Inc., Hoboken, NJ, USA.

* cited by examiner

*Primary Examiner* — Timothy V Eley

(74) *Attorney, Agent, or Firm* — Slater & Matsil, L.L.P.

(57) ABSTRACT

A method and a device for treating wafers on assembly carriers is disclosed. A wafer to be treated can be fixed on a liquid film that is located between the front side of the wafer and the assembly carrier by freezing of the film.

25 Claims, 1 Drawing Sheet

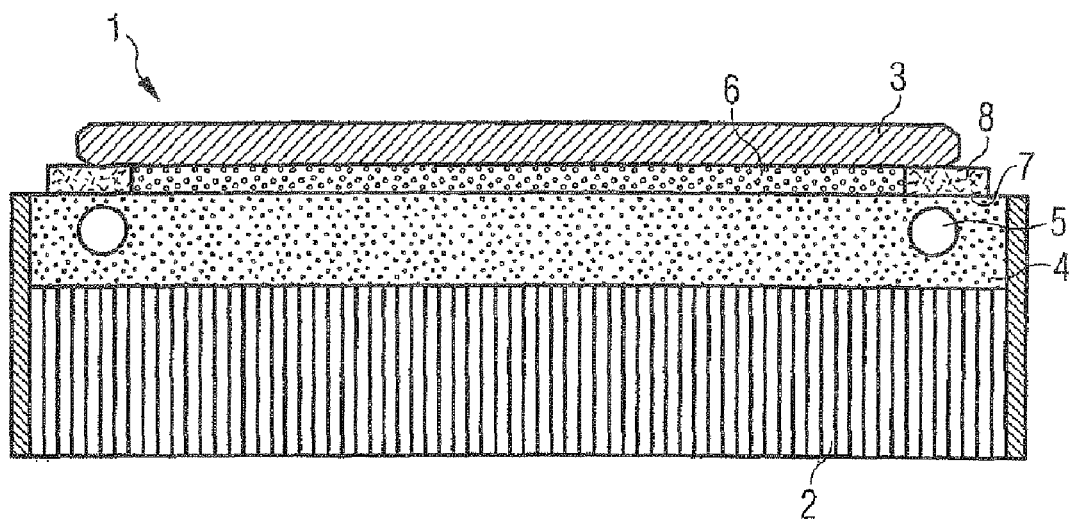
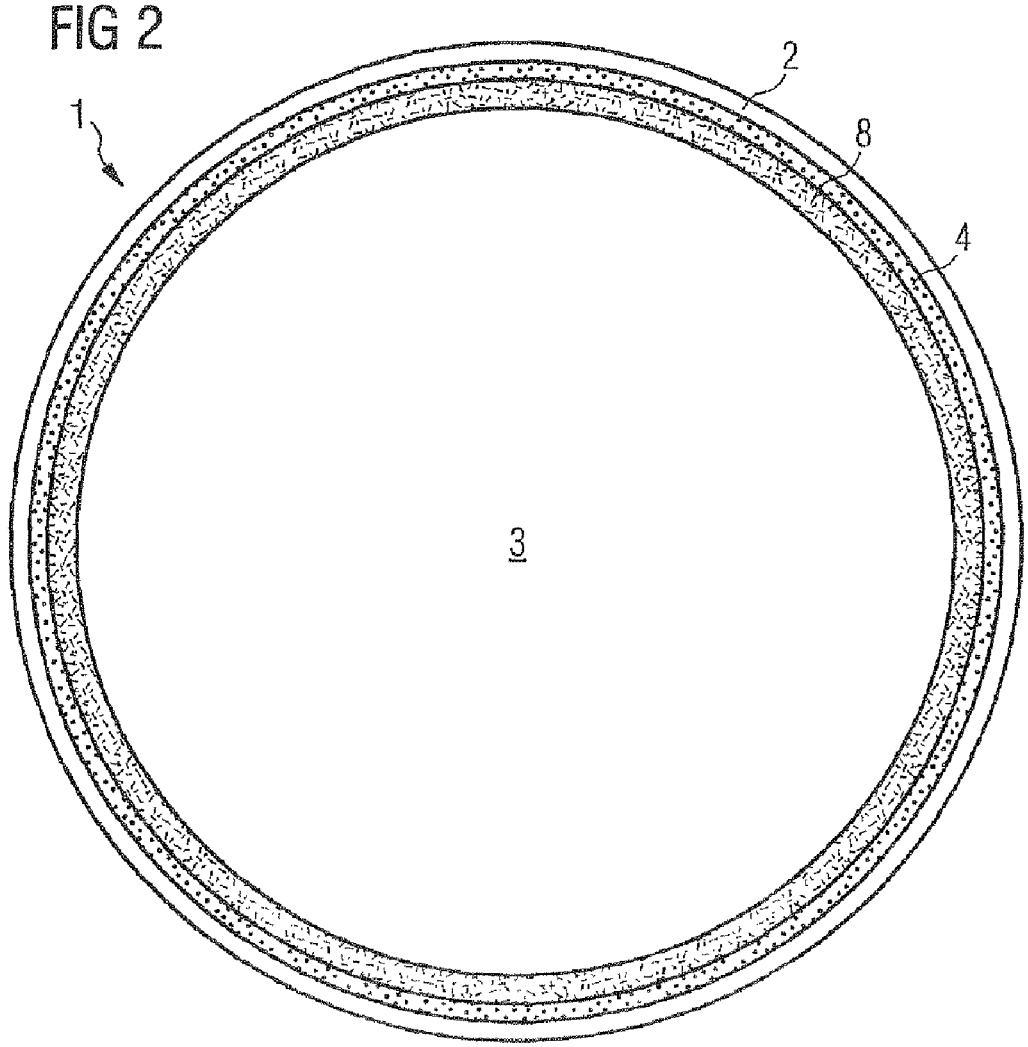

METHODS FOR TREATING WAFERS ON ASSEMBLY CARRIERS

This application is a continuation of co-pending International Application No. PCT/EP2006/050783, filed Feb. 8, 2006, which designated the United States and was not published in English, and which is based on German Application No. 10 2005 011 107.6 filed Mar. 10, 2005, both of which applications are incorporated herein by reference.

TECHNICAL FIELD

An embodiment of the present invention relates to a method and a device for treating wafers on assembly carriers, for example, for fixing and releasing wafers on assembly carriers.

BACKGROUND

For thinning the wafers before certain process steps, such as for example sawing or loading with components, the substrates are ground on the back side. A method of doing this that is known from practical use is one in which the front sides of the wafers are laminated with a protective film. The wafer is fixed with the laminated front side on the vacuum grinding table (vacuum chuck) and thinned by means of diamond-impregnated grinding wheels while cooling water is additionally applied.

The protective film is also intended to equalize and even out process-dependent differences in height in the circuits on the wafer. Pronounced topographies in the semiconductor circuit or pronounced substrate thinnings cause local nonuniform variations in the thickness of the substrate (dimples) during the grinding. Resultant mechanical stresses in the substrate can lead to cracks and chip rupture. In particular, in the case of more recent forms of flip-chip mounting, metal connectors (bumps) with a height of up to 150 µm are additionally applied on the front side, serving for direct contacting on printed circuit boards. These high bumps can no longer be smoothly covered with conventional protective films. Backside thinning below a substrate thickness of 300 µm without any deterioration is problematic.

Topographies on the wafer with a height of up to 50 µm can be equalized by means of thicker layers of adhesive on the protective films. However, possible remains of adhesive, and consequently increased contamination, pose a risk to the reliability of component mounting operations. Evening out by means of additional layers of lacquer on the surface of the wafer, and in particular their removal/disposal, make the process considerably more expensive. For even higher contact bumps, special films are being developed; the price of such films is twice that of the existing standard material.

The "protective film lamination" and "protective film removal" processes require dedicated devices of their own. In the laminating device, the protective film is adhesively attached to the upper side of the wafer and cut-off flush at the periphery of the wafer by a heated knife running around it. Thinning of the back side by grinding is followed in the peeling device by fixing the wafer on a vacuum chuck, adhesively attaching a special peeling adhesive tape and peeling off the protective film from the wafer while supplying ionized air (to counteract electrostatic charging during the peeling off of the film). These method steps are laborious.

Previously, the grinding thin of the wafers had to be performed before applying the contact bumps, which involved increased risk of rupture of the thin wafers in the subsequent metallizing and etching processes.

Various methods and devices that are concerned with the problems of fixing wafers on assembly carriers are also known from the patent literature. Some of these address the difficulties of fixing wafers on assembly carriers when the wafers are to be thinned.

One example of such a literature reference is European Patent publication, EP 1 148 554 A1, U.S. counterpart U.S. Pat. No. 6,683,332 B2. Described there is a method for the highly accurate and rapid thinning of a semiconductor substrate, which can be performed independently of the tolerance of an assembly carrier and an adhesive join with which the substrate is attached to the assembly carrier. For this purpose, a first doped layer with p dopant is formed in the substrate. Subsequently, the substrate is initially ground down from its back side and further etched back wet-chemically. In this case, the first doped layer serves as an etching resist. In this document, the following literature reference is cited by way of example as prior art: "Semiconductor Wafer Bonding: Science and Technology, Q. Y. Tong, Wiley-Interscience Publication". There it is described on pages 1 to 13 that, in the case of such a method, the process of thinning the semiconductor substrate is one of the technologically most demanding and expensive process steps. For the three-dimensional integration, usually two ready-processed wafers are first provided. The first wafer serves in this case as a carrier, the second wafer is thinned by the following method and arranged on the first wafer. For thinning, the second wafer is first provided with a layer of adhesive on its front side, which is the side with the electric circuits, and is then connected to an assembly carrier. The second wafer is then thinned from its back side, usually up to three methods being used sequentially.

The first method to be used is usually a grinding method, which is followed by a chemical etching method and chemical-mechanical polishing (CMP). The aim of this method is to retain a residual thickness of the semiconductor substrate in the range of 10 µm, special importance having to be attached to the planarity and the exact maintenance of the target thickness. On account of the different ways in which they work, the three thinning methods mentioned each entail different disadvantages, so that the best result is achieved by a combination of the known methods. Grinding is the quickest method, and is therefore used as the first step, in order to remove the greatest part of the semiconductor layer.

However, grinding causes deteriorations of the substrate surface, which are removed in a subsequent chemical etching step. The chemical etching step has the disadvantage, however, that the etched surface is not planar but has a waviness in the range of ±3%, the layer thickness removed by the etching step. For this reason, chemical-mechanical polishing CMP is carried out in a third step, whereby the waviness of the surface is polished out. The CMP step is slow and expensive and is therefore only used for the post-treatment of the surface. The mechanical grinding is used as the method with the greatest removal. The adjustment of the installation means that the removal during grinding occurs plane-parallel to the assembly carrier to which the second substrate wafer is attached.

Here it must be taken into consideration that a wafer that is not attached plane-parallel to the assembly carrier is ground away obliquely. Since the substrate wafer is attached to the assembly carrier, for example, by adhesive, there is an adhesive join between the substrate and the assembly carrier. If the adhesive join has a different layer thickness, as formed for example in the case of a wedge shape, the substrate is not aligned plane-parallel to the assembly carrier. In the subsequent grinding process, the substrate wafer is therefore not ground away plane-parallel to the surface in which the electric circuits are arranged. This problem can be solved, for example, by the adhesive join being made very thin. However, this has the disadvantage that no filled adhesives can be used, adhesives which would be advantageous during the later detachment of the substrate from the assembly carrier, since, for example, solvent can remove the adhesive more easily from thick adhesive joins. Likewise, the adjusting accuracy of the assembly carrier with respect to the grinding plate is transferred into the accuracy of the grinding process. On the other hand, it is not possible to dispense with the grinding process, since etching processes are too inaccurate and CMP is too slow.

There is, for example, a known method in which a buried oxide layer is used as an etching resist. Wafers which have such a buried oxide layer are known as SOI (silicon on insulator) wafers. These wafers are much more expensive than standard wafers and require a modified process procedure in the production of circuits in the silicon substrate as compared with conventional silicon wafers. This necessitates an adaptation of the process technology. Particularly disadvantageous in the case of SOI wafers is that they have great internal mechanical stresses. If SOI wafers are thinned to a few 10 µm and below, this leads to the silicon layer peeling off from the assembly carrier and to the silicon layer rolling up.

Devices that work differently are also known. For example, European Patent publication, EP 0 737 546 B1, U.S. counterpart U.S. Pat. No. 5,791,973, specifies as prior art a device which serves for the chemical-mechanical polishing of semiconductor substrates. As already mentioned, chemical-mechanical polishing is also referred to by the abbreviation CMP, which will be used hereafter.

In the cited documents, a description is given of a device which has a turntable that comprises a planar surface and consists of stable material, so that it is of a sufficiently rigid configuration. By means of the driven rotary shaft, the turntable is turned in a predeterminable direction. On the surface of the turntable there is a polishing pad and/or a polishing material. Above the turntable there is a holding head for the substrate to be polished, for example, a semiconductor wafer, referred to hereafter as wafer for short. The substrate holding head may likewise be formed in a rotatable manner. With the aid of the substrate holding head, the substrate to be polished is pressed against the polishing pad and polished on account of the relative rotational movements under the action of the abrasive material. The polishing operation takes place under certain contact pressure, and it may happen that the substrate to be polished becomes detached from the substrate holding head and moves over the turntable in an uncontrolled manner. This can cause damage to the device. If this happens, the substrate in any case becomes unusable.

SUMMARY OF THE INVENTION

In one aspect, the invention provides a method for treating wafers on assembly carriers, for example, for fixing and releasing wafers, and a device for carrying out the method. The wafer is handled with extreme care and the device for fixing and releasing the wafer is of a simple construction and it is possible for the method to be carried out reliably and easily.

In one embodiment, a method for treating wafers on assembly carriers is disclosed. For example, wafers can be fixed and released on the front sides of which electric circuits are arranged and the back sides of which are subjected to treatment steps. In a first embodiment, an assembly carrier is provided. The surface of the assembly carrier that is facing the wafer to be treated is wetted with a liquid film. The wafer to be treated is placed with its front side onto the liquid film. The liquid film is cooled until at least, or only, its peripheral zone or the entire contact surface solidifies thereby fixing the wafer to the assembly carrier. The back side of the wafer is treated. The solidified portions or zones of the liquid film is heated until they liquefy. The treated wafer is removed from the assembly carrier.

It is in this case advantageous if the cooling of the liquid film is performed by liquid nitrogen and if the liquid nitrogen is fed to the assembly carrier.

The liquid nitrogen may in this case be fed to the assembly carrier via the wafer.

It is also advantageous if the liquid nitrogen serves as a coolant and lubricant during the back-side treatment of the wafer.

The liquid nitrogen may, however, also be fed to the assembly carrier by channels.

Furthermore, it is an advantage that, as a result of the region of the liquid film that is kept liquid within the solidified peripheral zone, the front side of the wafer, provided with electric circuits, is protected from mechanical pressure peaks and vibrations during the back-side treatment of the wafer.

Furthermore, it is advantageous that, as a result of the solidifying of the peripheral zone of the liquid film, the penetration of foreign substances is prevented and contamination of the wafer and the assembly carrier is prevented.

In addition, it is an advantage that, as a result of the region of the liquid film that is kept liquid within the solidified peripheral zone, small particles which may be located on the assembly carrier or on the wafer do not damage the sensitive front side of the wafer that is provided with electric circuits, since they are embedded in liquid.

Furthermore, it is advantageous that, as a result of the cooling of the back side of the wafer, the oxidation on its surface is kept low during the treatment process.

It is particularly advantageous if at least one of the treatment steps is the grinding thin of the wafer, in particular, if it is the grinding thin of the back side of the wafer.

Particularly suitable for carrying out the method with the advantages described above is a device for fixing wafers on assembly carriers, in particular wafers of which the back sides are subjected to treatment steps, when there is a liquid film on the assembly carrier, in which the front side of the wafer can be embedded, and when furthermore there is a temperature-controlling device for controlling the temperature of the liquid film, it being possible by means of the temperature-controlling device for the state of aggregation of the liquid film to be partially changed in such a way that an annular peripheral zone of the liquid film can be made to solidify and the wafer can be fixed to the solidified peripheral zone.

Also of advantage is a device in which the assembly carrier comprises a vacuum table which has a ceramic element for receiving the wafer, and there is a liquid film between the ceramic element and the wafer.

A device is also favorable if there are channels in the peripheral zone of the ceramic element, and if media with the aid of which the state of aggregation of the liquid film can be changed flow in the channels, it being possible for the peripheral zone of the ceramic element to be cooled or heated by the flowing media.

Liquid nitrogen is suitable in a particularly advantageous way as the medium for cooling the peripheral zone, whereby the liquid film can be made to solidify in its peripheral zone.

A device produces particular advantages if hot water is used as the medium for heating the peripheral zone, as a result of which the peripheral zone of the liquid film thaws again, it being particularly appropriate for the hot water to be drained off from the cooling circuit of the waste process heat.

The device can be operated advantageously if the liquid film consists of an aqueous solution, in particular consists of water, it being favorable if a film of water is retained within the solidified peripheral zone.

A device is also advantageous if at least the ceramic element is adapted to the material of the wafer in terms of its thermal expansion behavior.

Also advantageous is the cost saving in respect of materials and investments and equipment, since there are no protective films or peeling films and no investments for laminating and peeling devices are required.

In addition, there are savings in respect of operator tasks, and also in respect of the provision of clean room areas, since the treatment can be carried out in classes of clean room that are subject to lower requirements, for example, more than 10 particles with a diameter greater than 0.1 micrometer per 28 l (1 ft$^3$) of air.

Furthermore, with the same throughput in the grinding machine, lower processing times in pre-assembly can be realized.

Furthermore, the risk of rupture is reduced as a result of reduced wafer handling.

Wafer bowing is less as a result of reduced Si oxide growth.

The method according to an embodiment of the invention and the device for carrying out the method can be used for all products such as memory, logic or power wafers with back-side thinning, in particular, also for what are known as bumped wafers.

An embodiment of the invention is also explained in more detail in the drawings on the basis of an exemplary embodiment of a device for fixing a wafer.

BRIEF DESCRIPTION OF THE DRAWINGS

For a more complete understanding of embodiments of the present invention, and the advantages thereof, reference is now made to the following descriptions taken in conjunction with the accompanying drawing, in which:

FIG. 1 shows a greatly simplified section through an assembly carrier; and

FIG. 2 shows a plan view of the assembly carrier according to FIG. 1.

DETAILED DESCRIPTION OF ILLUSTRATIVE EMBODIMENTS

According to the representation in FIG. 1, an assembly carrier 1 substantially comprises a vacuum table 2, on the surface of which that is facing the wafer 3 to be fixed there is a porous ceramic element 4. Running in the ceramic element 4 are channels 5, which serve for the heating or cooling of the ceramic element 4. Between the ceramic element 4 and the wafer 3 to be fixed there is a liquid film 6, formed from an aqueous solution, onto which the wafer 3 is placed with its front side and to a certain extent floats. The front side of the wafer 3 is to be understood as meaning that side of the surface on which the electric circuits are located. As a result of the process-related application of the circuits, the front side of the wafer 3 has relatively pronounced differences in height. As already described at the beginning, in particular, in the case of more recent forms of mounting for semiconductor chips, for example, for flip-chip mounting, additional metal connectors, known as bumps, with a height of up to, e.g., 150 μm are applied on the front side of the wafers, serving for direct contacting on printed circuit boards. Even these relatively extreme differences in height on the front side of the wafer 3 are equalized by the liquid film 6, since the liquid film 6 uniformly encloses the topographies.

The fixing is not then performed by vacuum chucking of the wafer 3 by way of the ceramic element 4, as in the prior art, but by targeted cooling of the ceramic 4 with the aid of liquid nitrogen, which flows through the channels 5. In this case, the ceramic 4, covered by the liquid film 6, is cooled in its peripheral zone 7 to the extent that there is peripheral icing 8 of the liquid film 6, which fixes the wafer 3 at its periphery. In order to make the icing possible it is advantageous to use an aqueous solution or water as the liquid film 6, which provides considerable cost advantages.

As a result of the peripheral icing 8, retained in the inner region of the peripheral icing 8 is a film of water 6, which bathes the topographies of the components and even the bumps, takes up and possibly absorbs the mechanical pressure peaks and vibrations during the grinding of the back side of the wafer 3 and keeps the front side of the wafer 3 free from exposure to any constraining forces. In this case, as a result of the hydrostatic pressure in the film of water 6, the grinding forces occurring from above during the back-side grinding of the wafer 3 are taken up and the wafer 3 is relieved.

If required, it is possible on account of the surface tension of the liquid film 6 for the wafer 3 to be adapted to a slightly conical shape of the chuck if—as in some cases—its center lies 40 μm higher than its peripheral region 7.

What is claimed is:

1. A method for processing a wafer, the method comprising:
    providing an assembly carrier;
    wetting with a liquid film a surface of the assembly carrier that is facing a wafer to be treated;
    placing a front side of the wafer to be treated onto the liquid film;
    cooling the liquid film until at least a peripheral zone of the liquid film solidifies without solidifying an inner zone of the liquid film, the wafer being fixed to the assembly carrier;
    treating a back side of the wafer;
    heating solidified portions of the liquid film until they liquefy; and
    removing the treated wafer from the assembly carrier.

2. The method as claimed in claim 1, wherein the liquid film comprises liquid nitrogen.

3. The method as claimed in claim 2, wherein the liquid nitrogen is fed to the assembly carrier.

4. The method as claimed in claim 3, wherein the liquid nitrogen is fed to the assembly carrier under the front side of the wafer.

5. The method as claimed in claim 2, wherein the liquid nitrogen serves as a coolant and lubricant during the back side treatment of the wafer.

6. The method as claimed in claim 2, wherein the liquid nitrogen is fed to the assembly carrier through channels.

7. The method as claimed in claim 1, wherein a region of the liquid film is kept liquid within the solidified peripheral zone such that the front side of the wafer is protected from mechanical pressure peaks and vibrations during the back side treatment of the wafer.

8. The method as claimed in claim 1, wherein, as a result of solidifying at least the peripheral zone of the liquid film penetration of foreign substances is prevented and contamination of the assembly carrier and the front side of the wafer is prevented.

9. The method as claimed in claim 1, wherein a region of the liquid film is kept liquid within the solidified peripheral zone such that small particles that may be located on the assembly carrier or on the wafer do not damage the front side of the wafer.

10. The method as claimed in claim 1, wherein as a result of cooling liquid oxidation on the back side of the wafer is kept low when treating the back side.

11. The method as claimed in claim 1, wherein treating the back side of the wafer comprises grinding the wafer.

12. A method for processing a wafer, the method comprising:
   providing an assembly carrier;
   wetting with a liquid film a surface of the assembly carrier that is facing a wafer to be treated;
   placing a front side of the wafer to be treated onto the liquid film;
   cooling the liquid film until a peripheral zone of the liquid film solidifies, the wafer being fixed to the assembly carrier, wherein a region of the liquid film is kept liquid within the solidified peripheral zone;
   treating a back side of the wafer;
   heating solidified portions of the liquid film until they liquefy; and
   removing the treated wafer from the assembly carrier.

13. The method as claimed in claim 12, wherein the liquid film comprises liquid nitrogen.

14. The method as claimed in claim 13, wherein the liquid nitrogen is fed to the assembly carrier.

15. The method as claimed in claim 13, wherein the liquid nitrogen serves as a coolant and lubricant during the back side treatment of the wafer.

16. The method as claimed in claim 13, wherein the assembly carrier comprises a vacuum table that has a ceramic table with a ceramic element, the ceramic element forming the surface of the assembly carrier.

17. The method as claimed in claim 16, wherein the liquid nitrogen is fed to the assembly carrier through channels within the ceramic elements.

18. The method as claimed in claim 12, wherein, as a result of solidifying at least the peripheral zone of the liquid film penetration of foreign substances is prevented and contamination of the assembly carrier and the front side of the wafer is prevented.

19. The method as claimed in claim 12, wherein, as a result of cooling, liquid oxidation on the back side of the wafer is kept low when treating the back side.

20. The method as claimed in claim 12, wherein treating the back side of the wafer comprises grinding the wafer.

21. A method for processing a wafer, the method comprising:
   providing an assembly carrier;
   wetting with a liquid film a surface of the assembly carrier that is facing a wafer to be treated;
   placing a front side of the wafer to be treated onto the liquid film;
   cooling the liquid film until a peripheral zone of the liquid film solidifies, the wafer being fixed to the assembly carrier;
   treating a back side of the wafer, wherein a region of the liquid film is kept liquid within the solidified peripheral zone such that the front side of the wafer is protected from mechanical pressure peaks and vibrations during the back side treatment of the wafer;
   heating solidified portions of the liquid film until they liquefy; and
   removing the treated wafer from the assembly carrier.

22. The method as claimed in claim 21, wherein small particles that may be located on the assembly carrier or on the wafer do not damage the front side of the wafer.

23. The method as claimed in claim 21, wherein the liquid film comprises liquid nitrogen.

24. The method as claimed in claim 23, wherein the assembly carrier comprises a vacuum table that has a ceramic table with a ceramic element, the ceramic element forming the surface of the assembly carrier.

25. The method as claimed in claim 24, wherein the liquid nitrogen is fed to the assembly carrier through channels within the ceramic element.

* * * * *